United States Patent [19]

Knierim

[11] Patent Number: 5,382,955
[45] Date of Patent: Jan. 17, 1995

[54] ERROR TOLERANT THERMOMETER-TO-BINARY ENCODER

[75] Inventor: Daniel G. Knierim, Beaverton, Oreg.

[73] Assignee: Tektronix, Inc., Wilsonville, Oreg.

[21] Appl. No.: 148,802

[22] Filed: Nov. 4, 1993

[51] Int. Cl.[6] .............................................. H03M 7/00
[52] U.S. Cl. ....................................... 341/64; 341/160
[58] Field of Search ....................... 341/64, 97, 160, 94

[56] References Cited

U.S. PATENT DOCUMENTS

| | | | |
|---|---|---|---|
| 4,586,025 | 4/1986 | Knierim | 341/64 |
| 4,712,087 | 12/1987 | Traa | 341/118 |
| 4,733,220 | 3/1988 | Knierim | 341/64 |
| 5,029,305 | 7/1991 | Richardson | 341/159 |
| 5,243,348 | 9/1993 | Jackson | 341/64 |
| 5,329,279 | 7/1994 | Barbu et al. | 341/50 |

Primary Examiner—Marc S. Hoff
Attorney, Agent, or Firm—John Smith-Hill; Daniel J. Bedell; Boulden G. Griffith

[57] ABSTRACT

A thermometer-to-binary encoder includes a set of J input stage encoders E(1) through E(J) and an output encoder D, where $J=2^K$ is an integer greater than 1. A set of digital input signals each representing a separate bit of a thermometer code T is grouped into J signal subsets representing further thermometer codes T(1) through T(J) providing inputs to a set of input stage encoders E(1) through E(J) respectively. Encoder E(J) produces an N-K+1 bit output binary code B(J) representing thermometer code T(J). Encoders E(1) through E(J−1) produce M-bit output binary codes G(1) through G(J−1), respectively, comprising the lower M bits of a binary code representing thermometer codes T(1) through T(J−1), respectively, where M is an integer greater than 1. Output encoder D processes codes G(1) through G(J−1) and B(J) to produce a set of digital output signals representing a binary code Y representing input thermometer code T.

18 Claims, 3 Drawing Sheets

ERROR TOLERANT THERMOMETER-TO-BINARY ENCODER

BACKGROUND OF THE INVENTION

1. Field of the Invention

The present invention, relates in general to thermometer-to-binary encoding systems and in particular to an encoding system which reduces errors in an output binary code resulting from out-of-sequence errors in an input thermometer code.

1. Description of Related Art

A number may be represented by a thermometer code wherein successive bits of a data word are assigned progressively larger values. All thermometer code bits having assigned values below or the same as the number are set to a logical true state (e.g. logical "1") and all of the bits having values higher than the number are set to a logical false state (e.g. logical "0"). In a typical analog-to-digital (A/D) converter, a reference voltage is divided into a set of progressively smaller reference voltage quantum levels. A comparator associated with each quantum level compares an analog input voltage with the voltage quantum and generates an output true state if the input voltage is higher than the voltage quantum reference. The outputs of all comparators form the bits of a thermometer code representing the magnitude of the input voltage when arranged in order of the associated reference voltage quantum level magnitudes.

In comparison to most other commonly used codes, thermometer codes do not represent numbers efficiently in terms of the number of bits required. For example, an eight-bit thermometer code can represent any one of 9 different numbers (0–8) whereas a typical eight-bit binary code can represent 256 different numbers. Therefore the thermometer code output of an A/D converter is usually itself converted by an encoding circuit into another more compact and useful binary code before being transmitted as data to external data processing circuits.

A problem arises when the bits of the thermometer code are out of sequence, i.e., when logical-true bits in the code are separated by one or more intervening logical-false bits. For example thermometer code "00011101" contains an out-of-sequence error. The "span" of the out-of-sequence error is equal to the number of intervening bits between the highest order "1" in the code and the highest order in-sequence "1" In the example the out-of-sequence error span is 3. An out-of-sequence error can happen when the thermometer code is produced by an A/D converter sampling a high frequency input signal where the individual comparators of the converter do not all switch at the same speed. For example, when the input signal voltage is falling at the time the A/D converter samples it, a fast lower order comparator may switch to a low output state before a relatively slower higher order comparator. When the out-of-sequence thermometer code is applied as an input to a typical thermometer-to-binary encoder, the output of the encoder may bear little relation to the actual magnitude of the sampled voltage. For many A/D converters a good approximation of the most likely magnitude of a sampled voltage which produces an out-of-sequence thermometer code is obtained by simply counting (summing) the logical-true bits in the out-of-sequence thermometer code. Thus engineers typically define the "value" of a thermometer code as the sum of its logical-true bits.

However, for typical systems, the cost in logic stages and processing times of a mechanism to directly add the individual bits of a thermometer code is prohibitive. Practical thermometer-to-binary encoders produce an output binary code whose value is equal to the value of the input thermometer code when the input code contains no out-of-sequence errors, but whose value may differ quite significantly from the value of the input thermometer code in the presence of out-of-sequence errors. Any difference between the value of the binary output code and the value of the thermometer input code is referred to as "encoding error." In the remainder of this specification, phrases such as "thermometer-to-binary encoder," "binary representation of thermometer code," "convert thermometer code to binary," etc., refer to an apparatus for or method of converting a thermometer code to a binary code that may contain encoding errors in the presence of out-of-sequence inputs.

U.S. Pat. No. 4,586,025 issued Apr. 29, 1986 to Daniel G. Knierim describes an error tolerant thermometer-to-binary encoder which reduces the encoding error in, for example, a 7-bit output binary code resulting from an out-of-sequence error in a 64-bit input thermometer code. The 64 1-bit signals of the thermometer code are grouped into four 16-bit subsets to form four smaller thermometer codes. Each thermometer code subset is then encoded into 5-bit binary form by a separate, conventional thermometer-to-binary encoder. The binary code outputs of the four encoders are then summed to produce the resulting binary code representing the 64-bit thermometer code. The 16-bit thermometer code subsets are grouped in such a way that each remains a legal 16-bit thermometer code as long as the out-of-sequence error in the 64-bit thermometer code has a span of less than 4. Thus, when the span of an error for the 64-bit thermometer code is less than 4, the described system produces no encoding errors. When the span is 4 or larger, encoding errors may occur, but in general they will be smaller in magnitude than the encoding errors in conventional thermometer-to-binary converters. However the described system still requires a substantial amount of hardware and processing time, but less hardware and processing time than a bit counting system.

Another problem associated with thermometer-to-binary conversion arises when a bit of the thermometer code is "metastable", at an invalid logic level intermediate in voltage between high and low logic levels. The output of a comparator is ideally one of two levels depending on the level of the input signal being sampled. But in practice a comparator may produce an output somewhere between high and low logic levels when the input signal voltage is sufficiently close to the reference voltage applied to the comparator. Also if the input voltage is changing rapidly when sampled, several comparators may produce metastable output signals simultaneously. To prevent invalid bits from being propagated through an encoder, the thermometer code output of an A/D converter is typically applied to a pipeline of clocked latches having positive feedback circuits to drive their outputs to stable high or low logic levels even when their inputs are at invalid ("metastable") levels. The stabilized output of each latch is then applied to the code conversion circuit. However this solution is hardware intensive since it requires many latches for each bit of the thermometer code.

In U.S. Pat. No. 4,733,220 issued Mar. 22, 1988 to Daniel G. Knierim, a thermometer-to-binary code converter uses a single stage latch array to stabilize all but the least significant bit of the thermometer code. The converter then converts the thermometer code to a Gray type (adjacent) binary code wherein only the least significant bit of the Gray code is metastable. The Gray code is then stabilized by a latch pipeline. The Gray code is subsequently converted to a standard binary form. Since the Gray code has fewer bits than the thermometer code, the number of latch stages required to produce the same degree of stability for a given clock rate is greatly reduced. However the system described in U.S. Pat. No. 4,733,220 can produce non-monotonic output in response to some out-of-sequence errors.

What is needed is a system for rapidly converting thermometer codes to binary codes which limits errors due to both out-of-sequence and metastable thermometer code bits and yet requires minimal hardware and processing time.

SUMMARY OF THE INVENTION

In accordance with the present invention, a thermometer-to-binary encoder includes a set of J input stage encoders E(1) through E(J) and an output encoder D, where suitably $J=2^K$ and K is an integer greater than 0. A set of digital input signals, each representing a bit of a thermometer code T, is grouped into J signal subsets representing further thermometer codes T(1) through T(J) providing inputs to input stage encoders E(1) through E(J) respectively. Encoder E(J) produces an output binary code B(J) representing thermometer code T(J). Encoders E(1) through E(J−1) produce M-bit output binary codes G(1) through G(J−1), respectively. Each binary code G(1) through G(J−1) represents the lower M bits of a binary code representing thermometer codes T(1) through T(J−1), respectively, where M is an integer greater than 1. Output encoder D processes codes G(1) through G(J−1) and B(J) to produce a set of digital output signals representing a binary code Y representing input thermometer code T.

In accordance with one embodiment of the present invention, the output stage encoder D includes a set of J−1 encoders A(1) through A(J−1) and an additional encoder L. Each encoder A(I) (for I=1 through J−1) has two inputs. The lower M bits G(J) of the binary code B(J) are applied to a first input of each encoder A(1) through A(J−1). The remaining binary codes G(1) through G(J−1) are applied to the second inputs of encoders A(1) through A(J−1), respectively. Each encoder A(I) produces an output binary remainder code R(I) having a value selected from the set $\{1-2^{M-1}, \ldots, 2^{M-1}\}$ in accordance with a difference between its two inputs, G(I) and G(J). Encoder L processes code B(J) along with codes R(1) through R(J−1) to produce an output signal conveying the output binary code Y representing thermometer code T.

In accordance with another embodiment of the present invention, the output stage encoder D includes a set of J−1 second stage encoders C(1) through C(J−1) and a set of three summers S1, S2 and S3. Each encoder C(I) has two inputs. Binary code G(J), the lower M bits of code B(J), is applied to a first input of each encoder C(1) through C(J−1) and the remaining binary codes G(1) through G(J−1) are applied to the second inputs of encoders C(1) through C(J−1), respectively. Encoder C(1) through C(J−1) produce output binary codes F(1) through F(J−1), respectively, the output code F(I) of each encoder C(I) having a value selected from the set $\{-1,0,1\}$ in accordance with a difference between its two inputs, G(I) and G(J). Summer S1 adds codes G(1) though G(J) to produce the M lowest bits Y(L) of binary output code Y. Summer S2 sums carry bit outputs of summer S1 and codes F(1) through F(J−1) to produce the next K bits Y(M) of output binary code Y. Summer S3 adds carry/borrow bit outputs of summer S2 (bit extended to the width of H(J)) to code H(J), the remaining bits of B(J), to produce the remaining bits Y(H) of output binary code Y.

It is an object of the invention to convert a thermometer code to a binary code without encoding errors for input out-of-sequence error spans within a certain range, and with minimal encoding errors for greater input out-of-sequence error spans, using less hardware than prior art systems.

The concluding portion of this specification particularly points out and distinctly claims the subject matter of the present invention. However those skilled in the art will best understand both the organization and method of operation of the invention, together with further advantages and objects thereof, by reading the remaining portions of the specification in view of the accompanying drawing(s) wherein like reference characters refer to like elements.

BRIEF DESCRIPTION OF THE DRAWING(S)

DESCRIPTION OF THE PREFERRED EMBODIMENT(S)

Figure 1:
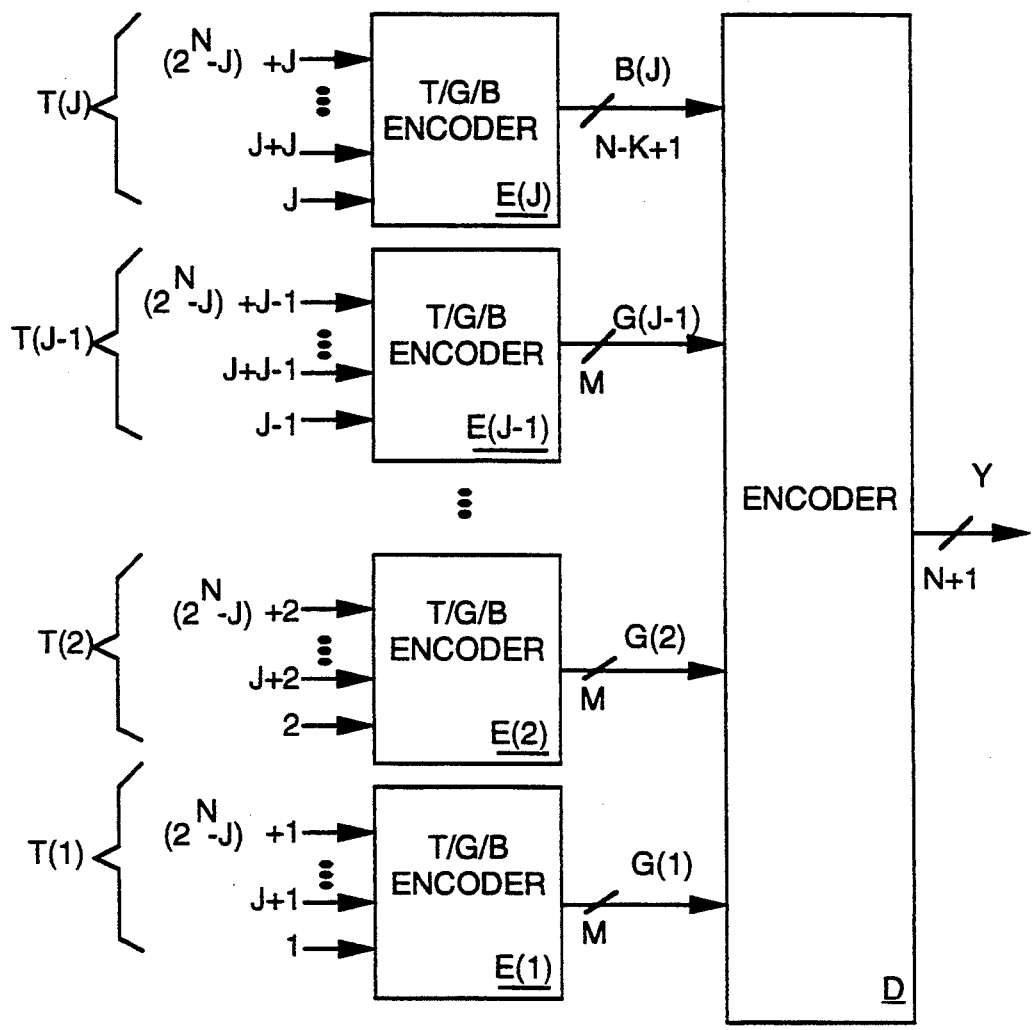
FIG. 1 is a block diagram illustrating a thermometer-to-binary encoder in accordance with the present invention.

The present invention relates to an encoder for converting a set of digital input signals conveying a thermometer code T to a set of output signals conveying a binary code Y, where Y represents T, A $2^N$-bit thermometer code represents each number X from 0 to $2^N$ by having its least significant X bits true (logical "1") and setting its remaining bits false ( logical "0"), A standard weighted binary code or a Gray (adjacent binary) code represents each number X from 0 to $2^N$ using only N+1 bits, Table I compares the thermometer code to standard binary and Gray codes for N=3.

TABLE I

| X | THERMOMETER | STANDARD BINARY | GRAY |
|---|---|---|---|
| 0 | 00000000 | 0000 | 0000 |
| 1 | 00000001 | 0001 | 0001 |
| 2 | 00000011 | 0010 | 0011 |
| 3 | 00000111 | 0011 | 0010 |
| 4 | 00001111 | 0100 | 0110 |
| 5 | 00011111 | 0101 | 0111 |
| 6 | 00111111 | 0110 | 0101 |
| 7 | 01111111 | 0111 | 0100 |

TABLE I-continued

| X | THERMOMETER | STANDARD BINARY | GRAY |
|---|---|---|---|
| 8 | 11111111 | 1000 | 1100 |

Note the Gray code is arranged so that with each increase in X only one bit in the Gray code changes.

A problem arises when the bits of the thermometer code are out of sequence, i.e., when logical-true bits in the code are separated by one or more intervening logical-false bits. For example thermometer code "00010011" contains an out-of-sequence error. The "span" of the out-of-sequence error is equal to the number of intervening bits between the highest order "1" bit and the highest order in-sequence "1" bit. In the example, the span is 2. An out-of-sequence error can happen when the thermometer code is produced by an A/D converter sampling a high frequency input signal where the individual comparators of the converter do not all switch at the same speed. For example, when the input signal voltage is falling at the time the A/D converter samples it, a fast lower order comparator may switch to a low output state before a slower higher order comparator. When an out-of-sequence thermometer code is applied as an input to a typical thermometer-to-binary encoder, the output of the encoder may bear little relation to the actual magnitude of the sampled voltage. For many A/D converters a good approximation of the most likely magnitude of a sampled voltage producing an out-of-sequence thermometer code is obtained by simply counting (summing) the logical-true bits in the out-of-sequence thermometer code. Thus engineers typically define the "value" of a thermometer code as the sum of its logical-true bits. However a thermometer-to-binary encoder which directly counts the bits of the thermometer code to produce the binary code requires a relatively large amount of logic hardware and processing time and may not be practical for high speed operation. Thus it is desirable to find a more efficient way to convert a thermometer code to a binary code wherein the binary code represents as nearly as possible a sum of true bits of the thermometer code.

We can partition a $2^N$-bit thermometer code into a set of J thermometer codes $T(1)+T(2) \ldots T(J)$, where J is preferably a power of 2. Each thermometer code includes the Ith bit of thermometer code T and every Jth bit thereafter. Thus for $2^N$-bit thermometer code T expressed as a set of bits numbered for 1 through $2^N$, $$T = \{2^N, \ldots, 2, 1\}$$

each partition T(I) of T consists of a set of bits:

$$T(I) = \{(2^N-J)+I, \ldots, 2J+I, J+I, I\} \qquad [1]$$

If we define the "value" of a thermometer code as equal to the sum of its logically true bits, then the value of the thermometer code is equal to the sum of the values of its partitions:

$$T = T(J) + T(J-1) + \ldots + T(1) \qquad [2]$$

A thermometer-to-binary encoder of the prior art, described in U.S. Pat. No. 4,586,025, makes use of expression [2] to convert a $2^N$-bit thermometer code to a binary code. The described apparatus first partitions the input code T into J partitions (where $J=2^K$) and then converts each code partition T(1) through T(J) to a corresponding binary code and then sums the resulting J binary codes. The result will equal the value of the thermometer code when the code has an out-of-sequence error span less than J because each code partition is free of out-of-sequence errors.

When the out-of-sequence error span is J or larger, the result may not equal the value of the thermometer code (i.e., the sum of its logical-true bits) but will be a better approximation of the thermometer code value than many conventional converter outputs. Stabilizing and summing J N-K+1 bit binary codes resulting from the thermometer code partitions requires less hardware than stabilizing and summing $2^N$ single bits of thermometer code T. However, even stabilizing and summing a set of $2^K$ N-K+1 bit codes becomes a formidable operation as N grows large.

The present invention further reduces the amount of hardware needed to convert a thermometer code to a binary code. The present invention makes use of the fact that the right side of expression [2] can be rewritten as follows:

$$T = J*T(J) + [T(J-1)-T(J)] + \ldots + [T(1)-T(J)] \qquad [3]$$

If we convert each thermometer code T(I) to a binary code B(I), then we can determine a binary code Y representing T in accordance with:

$$Y = J*B(J) + [B(J-1)-B(J)] + \ldots + [B(1)-B(J)] \qquad [4]$$

Assuming standard thermometer-to-gray-to-binary encoders, then when there is no out-of-sequence error span in T, B(I)-B(J) will have a value in the set $\{0,1\}$. When the span is less than J, B(I)-B(J) will have a value in the set $\{-1,0,1,2\}$. When the span is less than or equal to $J*(2^{M-2}-1)$, B(I)-B(J) will have a value in the set $\{1-2^{M-1}, \ldots, 2^{M-1}\}$ The function XMod$2^M$ is herein defined as a remainder of $X/2^M$ having permissible values in the set, $\{1-2^{M-1}, \ldots, 2^{M-1}\}$. We can determine [B(I)-B(J)]Mod$2^M$ from the difference between the M least significant bits of B(I) and the M least significant bits of B(J):

$$R(I) = [B(I)-B(J)]Mod2^M = [G(I)-G(J)]Mod2^M \qquad [5]$$

where G(I) is a code formed by the M least significant bits of B(I). Note that for out-of-sequence errors in T with a span less than or equal to $J*(2^{M-2}-1)$, R(I) = B(I)-B(J). Thus, we may determine a binary code Y representing T in accordance with:

$$Y = J*B(J) + R(J-1) + \ldots + R(1) \qquad [6]$$

Thus the following method converts an input thermometer code T to an output binary code Y:

1. partition thermometer code T into thermometer codes T(1) through T(J) in accordance with expression [1],
2. convert thermometer codes T(1) through T(J-1) into corresponding M-bit binary codes G(1) through G(J-1), where G(I) is the M least significant bits of the binary conversion of T(I), and convert thermometer code T(J) into corresponding N-K+1 bit binary code B(J),
3. evaluate R(1) through R(J-1) in accordance with expression [5], and then
4. find Y in accordance with expression [6].

This value of Y provides the value of T for out-of-sequence error spans less than J and provides the same result as the system described in U.S. Pat. No. 4,586,025 for error spans less than or equal to $J*(2^{M-2}-1)$.

FIG. 1 illustrates a thermometer-to-binary encoder in accordance with the present invention which carries out this process. A $2^N$-bit code T is represented by a set of $2^N$ digital input signals labeled 1 through $(2^N-J)+J$ where $J=2^K$ and K is an integer greater than 0. Input signal 1 represents the lowest bit of the thermometer code T and input signal $(2^N-J)+J$ represents the highest bit. The digital input signals are grouped into J subsets themselves representing thermometer codes T(1) through T(J). The grouping pattern is such that for I=1 to J, the signal subset representing code T(I) starts with the code T, bit I and every Jth bit thereafter as described by expression [1]. Thus the thermometer code T is partitioned in accordance with step 1 above.

Step 2 above is carried out by a set of J input stage encoders E(1) through E(J). Thermometer codes T(1) through T(J-1) are applied as inputs to encoders E(1) through E(J-1), respectively, which produce corresponding M-bit output binary codes G(1) through G(J-1), respectively. Encoder E(J) converts thermometer code T(J) into equivalent N-K+1 bit binary code B(J).

Steps 3 and 4 above are carried out by an output stage encoder D. Binary codes G(1) through G(J-1) and B(J) are all applied as inputs to encoder D which processes codes G(1) through G(J-1) and B(J) to produce a set of N+1 digital output signals representing an output binary code Y having a value representing the value of original input thermometer code T for error spans less than J and approximating it for error spans equal to or greater than J.

Figure 2:
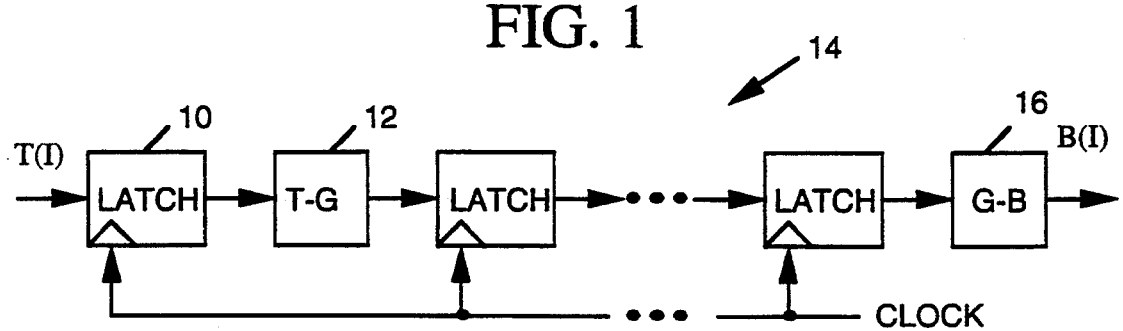
FIG. 2 is a block diagram illustrating a thermometer-to-Gray-to-binary encoder block of FIG. 1.

Encoders E(1) though E(J) are suitably regenerative thermometer-to-Gray-to-binary encoders well known in the prior art. One such encoder illustrated in U.S. Pat. No. 4,733,220, is incorporated herein by reference. FIG. 2 also illustrates a prior art thermometer-to-Gray-to-binary encoder which may implement any one of encoders E(1) though E(J) of FIG. 1.

Referring to FIG. 2, in response to a CLOCK signal a regenerative latch 10 latches an input thermometer code T(I) onto the input of an encoder 12. Encoder 12 converts the thermometer code to a Gray code. The CLOCK signal then clocks the Gray code signal output of encoder 12 through a sequence of regenerative latches 14 and onto the input of a Gray-to-binary encoder 16 which produces the output binary code B(I). In the present invention, as discussed herein above for I less than J, only the M least significant bits of output code B(I) are used to form code G(I). Therefore portions of thermometer-to-binary encoder 14 which produce higher order output bits need not be implemented when forming encoders E(1) through E(J-1).

As discussed in U.S. Pat. No. 4,733,220 latch 10 normally stabilizes all but the least significant bit of the input thermometer code. Since the thermometer code is first converted into an adjacent binary code (e.g., the Gray code) the metastable bit in the thermometer code propagates into only the least significant bit of the Gray code. That bit is subsequently stabilized by latches 14.

Figure 3:
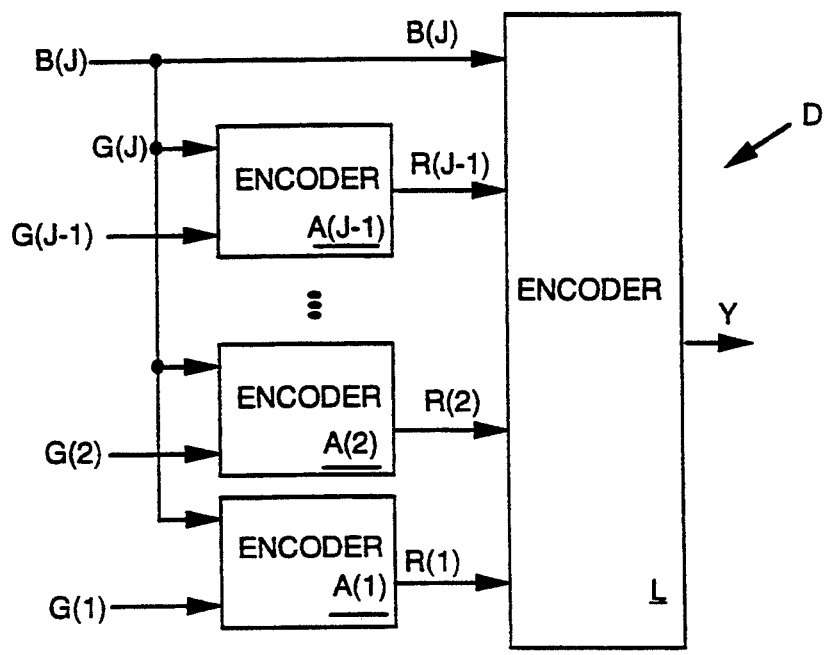
FIG. 3 is a block diagram illustrating one embodiment of the output stage encoder of FIG. 1.

A number of encoding schemes may be used to implement encoder D of FIG. 1, the function of which is to produce a value for Y based on the inputs B(J) and G(1) through G(J-1). FIG. 3 is a block diagram of a preferred embodiment of encoder D of FIG. 1. As shown in FIG. 3, encoder D includes a set of encoders A(1) through A(J-1) each having two inputs. Binary codes G(1) through G(J-1) are each applied to one input the corresponding encoder A(1) through A(J-1). The M least significant bits G(J) of code B(J) drives the other input of each encoder A(I). Encoders A(1) through A(J-1) produce remainder output codes through R(J-1), respectively, in accordance with expression [5] herein above. Thus encoders A(1) through A(J-1) perform step 3 herein above.

Code B(J) and remainder codes R(1) through R(J-1) are supplied as inputs to yet another encoder L which implements expression [6] herein above to produce the output signal conveying output binary code Y.

Figure 4:
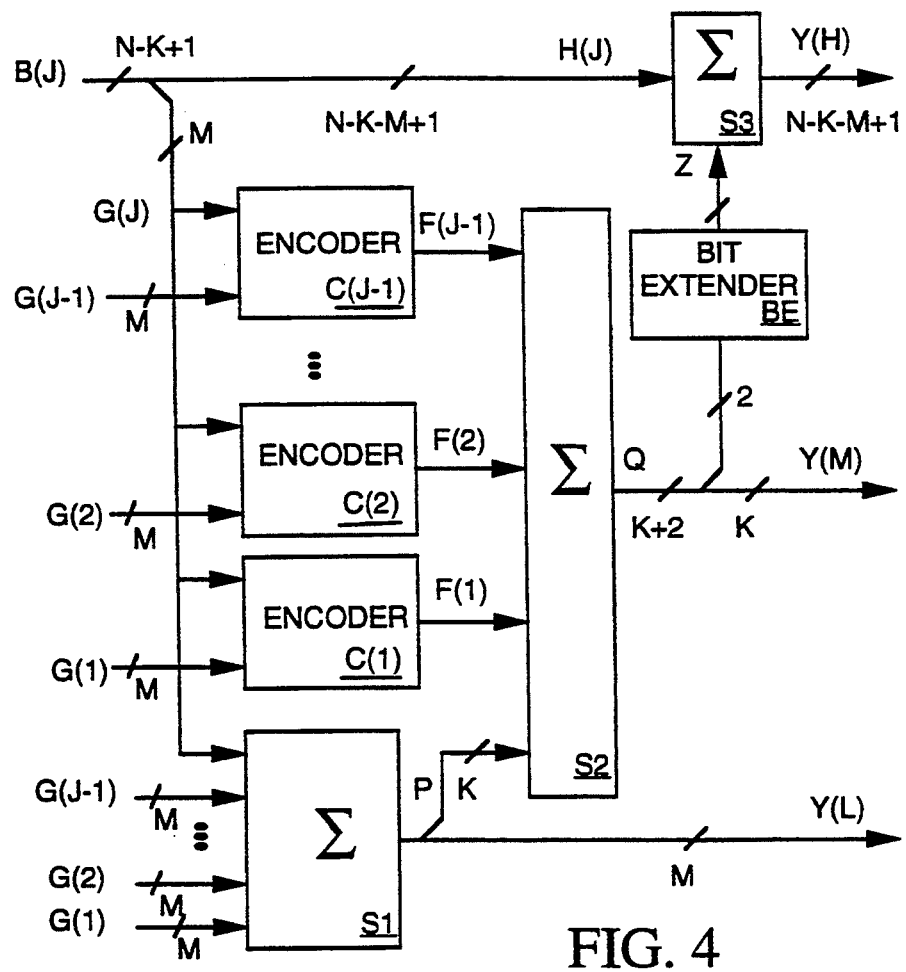
FIG. 4 is a block diagram illustrating an alternative embodiment of the output state encoder of FIG. 1.

FIG. 4 illustrates an alternative embodiment of encoder D of FIG. 1. Letting $B(J)=2^M H(J)+G(J)$, where G(J) is a code formed by the M least significant bits of B(J) and H(J) is a code formed by the remaining more significant bits of B(J); and letting $$F(I)=2^{31\,M}[(G(J)-G(I))+(G(I)-G(J))MOD2^M] \qquad [7]$$

then from expressions [5], [6] and [7], $$Y=2^M JH(J)+2^M[F(J-1)+\ldots+F(1)]+[G(J)+\ldots G(1)] \qquad [8]$$

By definition F(I) is a function of only G(I) and G(J) as given in table II below.

TABLE II

| F(I) | G(I)–G(J) |
|---|---|
| 1 | $<1-2^{M-1}$ |
| −1 | $>2^{M-1}$ |
| 0 | Otherwise |

FIG. 4 illustrates an alternative embodiment of encoder D of FIG. 1 which implements expression [8] and Table II to obtain Y from codes B(J) and G(1) through G(J-1). As shown in FIG. 4, encoder D includes a set of three summers S1, S2 and S3 and a set of J−1 encoders C(1) through C(J-1).

Codes G(1) through G(J-1) are supplied to one input of a corresponding encoder C(1) through C(J-1). Code G(J), the lower M bits of code B(J), is supplied to a second input of each encoder C(1) through C(J-1). Each encoder C(I) produces an output F(I) having a value of −1, 0 or 1 in accordance with the relation shown in table II.

Summer S1 adds M-bit codes G(1) through G(J) to produce the lower M bits Y(L) of output binary code Y along with K carry bits P. Summer S2 sums the K carry bits from summer S1 with F(1) through F(J-1) to produce the next M bits Y(M) of output binary code Y along with 2 carry/borrow bits Z. Summer S3 adds the carry/borrow bits of code Z output of summer S2 (Z having been extended to N-K-M+1 bits by a bit extender BE) to the upper bits H(J) of code B(J) to produce Y(H), the upper N-K-M+1 bits of output binary code Y. The signal conveying the output binary code Y is formed by the N+1 binary signals each conveying a bit of Y where

Y=[Y(H),Y(M),Y(L)].

The logic required to implement encoder L of FIG. 3 can be significantly reduced if the sum of R(1) through R(J-1) is limited to the range 0 through J−1 before being added to J*B(J). This will make the output value Y differ from the ideal value of T for some input codes with error span <J, but will not cause any errors for legal thermometer codes.

Figure 5:
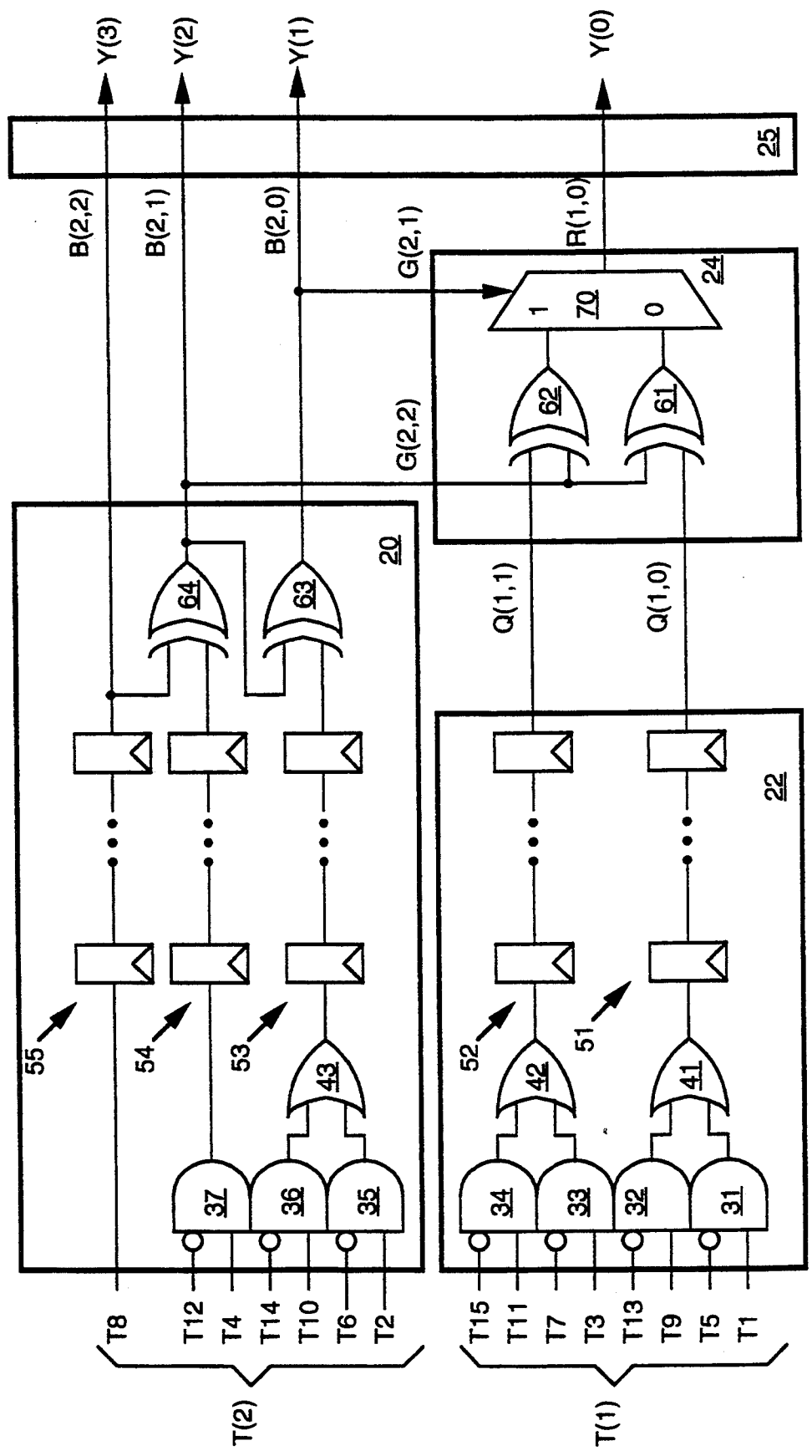
FIG. 5 is a schematic diagram of a thermometer-to-binary encoder in accordance with the present invention.

FIG. 5 is a schematic diagram of a modified thermometer-to-binary encoder for a case in which N=4, K=1 and M=2. In such case expression [6] above reduces to $$Y = 2*B(2) + R(1) \qquad [9]$$

where R(1) is limited to the set {0,1}.

The encoder of FIG. 5 receives as input thermometer code bits T1 through T15 and produces a 4-bit binary code output Y. Bits T1-T15 are partitioned according to expression [1] herein above into two thermometer code subsets T(1) and T(2) where $$T(1) = (T15, T13, \ldots T3, T1)$$

$$T(2) = (T14, T12, \ldots T4, T2).$$

Code T(2) is applied as input to a thermometer-to-Gray-to-binary converter 20 which produces an N-K (3) bit output code B(2) formed by bits B(2,2), B(2,1) and B(2,0). Encoder 20 implements encoder E(J) of FIG. 1 for J=2. Code T(1) provides input to a thermometer-to-Gray converter 22 which produces an M-bit (2-bit) output code Q(1) comprising bits Q(1,1) and Q(1,0). Encoder 22 of FIG. 5 implements a part of encoder E(1) of FIG. 1. The lower M bits of B(2) and code Q(1) provide input to an encoder 24 which produces as output the single bit code R(1)=G(1)-G(2). Encoder 24 of FIG. 5 implements the rest of encoder E(1) of FIG. 1 and encoder A(1) of FIG. 3.

The outputs of encoders 20 and 24 thus comprise the codes B(2) and R(1) in expression [9] above. To complete the process of converting thermometer code T into binary code Y in accordance with expression [9], final stage encoder 25 must multiply B(2) by J and add the result to R(1). However in this case, this function of the output stage encoder 25 is carried out simply by assigning R(1) to the least significant bit position Y(0) of output code Y and by assigning bits B(2,2), B(2,1) and B(2,0) to the remaining bit positions Y(3), Y(2) and Y(1) of output code Y.

As has been described herein above the present invention converts a thermometer code to a binary code by partitioning the thermometer code into J smaller thermometer codes, separately converting the smaller thermometer codes to binary codes and then processing the results. The invention differs from prior art converters in that only one of the thermometer code partitions is converted to a full N−K+1 bit binary code B(J). The remaining J−1 code partitions are converted into M-bit codes which represent only the M least significant bits of binary codes representing the corresponding thermometer code partitions. The logic circuitry required to generate one N−K+1 bit code and $2^K - 1$ M bit codes can be smaller and faster than logic which generates $2^K N - K + 1$ bit codes. Even though a converter in accordance with the present invention can be implemented with much less hardware, it nonetheless provides the ideal output (i.e., the sum of logical-true thermometer code bits) for out-of-sequence error spans less than J and produces a result that is as close to ideal as the prior art system described by U.S. Pat. No. 4,586,025 for error spans less than or equal to $J*(2^{M-2} - 1)$.

While the forgoing specification has described preferred embodiment(s) of the present invention, one skilled in the art may make many modifications to the preferred embodiment without departing form the invention in its broader aspects. The appended claims therefore are intended to cover all such modifications as fall within the true scope and spirit of the invention.

I claim:

1. A method for converting a set of digital input signals forming a thermometer code T into a plurality of digital output signals forming a binary code Y representing thermometer code T, the method comprising the steps of:

partitioning said set of digital input signals into J subsets such that each subset forms a separate one of a set of thermometer codes T(1) through T(J), where J is an integer greater than 1;

processing the thermometer code T(J) to produce a binary code B(J) representing thermometer code T(J) and a code G(J) consisting of a least significant portion of code B(J);

processing thermometer codes T(1) through T(J−1) to produce binary codes G(1) through G(J−1), respectively, where each binary code G(1) through G(J−1) consists of a least significant portion of a binary code representing thermometer code T(1) through T(J−1), respectively; and processing codes B(J) and G(1) through G(J) to produce said plurality of digital output signals forming said binary code Y.

2. The method in accordance with claim 1 wherein the step of processing codes B(J) and G(1) through G(J) to produce said plurality of digital output signals forming said binary code Y comprises the steps of:

generating a set of codes R(1) through R(J−1), each code R(1) through R(J−1) quantifying a relationship between a value of a corresponding code G(1) through G(J−1) and a value of code G(J); and processing codes B(J) and R(1) through R(J−1) to produce said plurality of digital output signals forming said binary code Y.

3. The method in accordance with claim 2 wherein the step of generating a set of codes R(1) through R(J−1) quantifying a relationship between a value of a corresponding code G(1) through G(J−1) and a value of code G(J) comprises determining a difference between a value of a corresponding code G(1) through G(J−1) and a value of code G(J).

4. The method in accordance with claim 2 wherein the step of processing codes B(J) and R(1) through R(J−1) to produce said plurality of digital output signals forming said binary code Y comprises the step of generating binary code Y in accordance with the expression $Y = J*B(J) + R(J-1) + \ldots + R(1)$.

5. The method in accordance with claim 1 wherein the step of processing codes B(J) and G(1) through G(J) to produce said plurality of digital output signals forming said binary code Y comprises the steps of:

forming a code H(J) comprising bits of code B(J) not included in code G(J);

generating a set of codes F(1) through F(J−1), each code F(1) through F(J−1) quantifying a relationship between code G(J) and a corresponding code G(1) through G(J−1), respectively; and processing codes H(J), F(1) through F(J−1) and G(1) through G(J) to produce said binary code Y.

6. The method in accordance with claim 5 wherein the step of processing codes H(J), F(1) through F(J−1)

and G(1) through G(J) to produce said binary code Y comprises the step of generating a sum of codes G(1) through G(J).

7. The method in accordance with claim 5 wherein the step of processing codes H(J), F(1) through F(J−1) and G(1) through G(J) to produce said binary code Y comprises the step of generating a code representing a sum of codes G(1) through G(J) and codes F(1) through F(J−1).

8. The method in accordance with claim 7 wherein successive signals of said digital input signals represent successively higher weighted bits of said thermometer code T and wherein for each value of an integer N between 1 and J, inclusive, subset T(N) of said J subsets consists of the Nth and every Jth one thereafter of said successive digital input signals.

9. The method in accordance with claim 1 wherein successive signals of said digital input signals represent successively higher weighted bits of said thermometer code T and wherein for each value of an integer N between 1 and J, inclusive, subset T(N) of said J subsets consists of the Nth and every Jth one thereafter of said successive digital input signals.

10. An apparatus for converting a set of digital input signals forming a thermometer code T into a plurality of digital output signals forming a binary code Y representing thermometer code T, wherein said set of digital input signals are partitioned into J subsets such that each subset forms a separate one of a set of thermometer codes T(1) through T(J), where J is an integer greater than 1, the apparatus comprising means for processing the thermometer code T(J) to produce a binary code B(J) representing thermometer code T(J) and a binary code G(J) consisting of a least significant portion of code B(J);

means for processing thermometer codes T(1) through T(J−1) to produce binary codes G(1) through G(J−1), respectively, where each binary code G(1) through G(J−1) consists of a least significant portion of a binary code representing thermometer code T(1) through T(J−1), respectively; and means for processing codes B(J) and G(1) through G(J) to produce said plurality of digital output signals forming said binary code Y.

11. The apparatus in accordance with claim 10 wherein said means for processing codes B(J) and G(1) through G(J) to produce said plurality of digital output signals forming said binary code Y comprises:

means for generating a set of codes R(1) through R(J−1), each code R(1) through R(J−1) quantifying a relationship between a corresponding code G(1) through G(J−1) and code G(J); and means for processing codes B(J) and R(1) through R(J−1) to produce said plurality of digital output signals forming said binary code Y.

12. The apparatus in accordance with claim 11 wherein said means for generating a set of codes R(1) through R(J−1) quantifying a relationship between a corresponding code G(1) through G(J−1), and code G(J) comprises means for determining a value difference between a corresponding code G(1) through G(J−1) and code G(J).

13. The apparatus in accordance with claim 11 wherein said means for processing codes B(J) and R(1) through R(J−1) to produce said plurality of digital output signals forming said binary code Y comprises means for generating binary code Y in accordance with the expression $Y = J*B(J) + R(J−1) + \ldots + R(1)$.

14. The apparatus in accordance with claim 10 wherein said means for processing codes B(J) and G(1) through G(J) to produce said plurality of digital output signals forming said binary code Y comprises:

means for generating a set of codes F(1) through F(J−1), each code F(1) through F(J−1) quantifying a relationship between code G(J) and a corresponding code G(1) through G(J−1), respectively; and means for processing a code H(J), codes F(1) through F(J−1), and codes G(1) through G(J) to produce said binary code Y, where code H(J) comprises bits of code B(J) not included in code G(J).

15. The apparatus in accordance with claim 14 wherein said means for processing codes H(J), F(1) through F(J−1) and G(1) through G(J) to produce said binary code Y comprises means for generating a sum of codes G(1) through G(J).

16. The apparatus in accordance with claim 14 wherein said means for processing codes H(J), F(1) through F(J−1) and G(1) through G(J) to produce said binary code Y comprises means for generating a code representing a sum of codes G(1) through G(J) and codes F(1) through F(J−1).

17. The apparatus in accordance with claim 16 wherein successive signals of said digital input signals represent successively higher weighted bits of said thermometer code T and wherein for each value of an integer N between 1 and J, inclusive, subset T(N) of said J subsets consists of the Nth and every Jth one thereafter of said successive digital input signals.

18. The apparatus in accordance with claim 10 wherein successive signals of said digital input signals represent successively higher weighted bits of said thermometer code T and wherein for each value of an integer N between 1 and J, inclusive, subset T(N) of said J subsets consists of the Nth and every Jth one thereafter of said successive digital input signals.

* * * * *